(12) United States Patent
Cheng et al.

(10) Patent No.: US 6,524,937 B1
(45) Date of Patent: Feb. 25, 2003

(54) SELECTIVE T-GATE PROCESS

(75) Inventors: Ying Michael Cheng, Thousand Oaks, CA (US); Thomas Richard Lepkowski, Merrimack, NH (US); Costas Varmazis, Chelmsford, MA (US)

(73) Assignee: Tyco Electronics Corp., Middletown, PA (US)

( * ) Notice: Subject to any disclaimer, the term of this patent is extended or adjusted under 35 U.S.C. 154(b) by 37 days.

(21) Appl. No.: 09/644,131

(22) Filed: Aug. 23, 2000

(51) Int. Cl.[7] .................. H01L 21/44; H01L 21/338
(52) U.S. Cl. .................. 438/574; 438/577; 438/579; 438/670; 438/182
(58) Field of Search .................. 438/574, 579, 438/573, 578, 666, 182, 167, 576, 577, 670, 951

(56) References Cited

U.S. PATENT DOCUMENTS

| | | | | |
|---|---|---|---|---|
| 4,090,006 A | * | 5/1978 | Havas et al. | 428/81 |
| 4,315,984 A | * | 2/1982 | Okazaki et al. | 438/670 |
| 4,398,341 A | * | 8/1983 | Geipel, Jr. et al. | 438/592 |
| 4,451,971 A | * | 6/1984 | Milgram | 438/670 |
| 4,489,101 A | * | 12/1984 | Shibata | 438/717 |
| 4,576,678 A | * | 3/1986 | Shibata | 216/40 |
| 4,731,339 A | * | 3/1988 | Ryan et al. | 438/172 |
| 4,771,017 A | * | 9/1988 | Tobin et al. | 438/98 |
| 5,006,478 A | * | 4/1991 | Kobayashi et al. | 438/577 |
| 5,053,348 A | * | 10/1991 | Mishra et al. | 438/571 |
| 5,391,899 A | * | 2/1995 | Kohno | 257/192 |
| 5,470,767 A | * | 11/1995 | Nakamoto et al. | 438/570 |
| 5,587,328 A | * | 12/1996 | Yoshida | 438/570 |
| 5,686,325 A | * | 11/1997 | Moriuchi et al. | 438/571 |
| 5,766,967 A | | 6/1998 | Lai et al. | 438/167 |
| 5,804,474 A | * | 9/1998 | Sakaki et al. | 438/167 |
| 5,930,610 A | * | 7/1999 | Lee | 438/182 |

OTHER PUBLICATIONS

H. Schink, et al., "Sub–Micron Self–Aligned–Gate HEMT for Microwavev Applications," *Solid–State Electronics*, vol. 34, No. 11,1991, pp. 1247–1250.

Shigeki Wada, et al., "0.2–um Fully–Self–Aligned Y–Shaped Gate HJFET's with Reduced Gate–Fringing Capacitance Fabricated Using Collimated Sputtering and Electroless Au–Plating," *IEEE Transactions On Electron Devices*, vol. 45, No. 8, Aug. 1998, pp. 1656–1662.

Jong–Lam Lee, et al., "A Ku–Band T–Shaped Gate GaAs Power MESFET with High Breakdown Voltage for Satellite Communications," *IEEE Electron Device Letters*, vol. 19, No. 7, Jul. 1998, pp. 250–252.

Jan–Erik Muller, et al., "A GaAs HEMT NMIC Chip Set for Automotive Radar Systems Fabricated by Optical Stepper Lithography," IEEE Journal of Solid–State Circuits, vol. 32, No. 9, Sep. 1997, pp. 1342–1349.

Jerry Leonard, "0.25 Micron Optical T–gate Development For GaAs Device Applications Using Chromeless Phase Shift Technology," 1998 GaAs MANTECH, pp. 173–176.

Hiroshi Takenaka, et al., "0.15 um T–shaped Gate Fabrication for GaAs MODFET Using Phase Shift Lithography," IEEE Transactions on Electron Devices, vol. 43, No. 2, Feb. 1996, pp. 238–244.

* cited by examiner

Primary Examiner—Matthew Smith
Assistant Examiner—Lex H. Malsawma

(57) ABSTRACT

A process of simultaneously forming a plurality of metal features on a substrate, in which at least one metal feature has undercut sides and at least one metal feature does not have undercut sides involves the application of a lower photoresist feature having rounded sides and an upper photoresist feature having undercut sides wherein the upper photoresist feature is positioned in offset relation to the lower photoresist feature such that one edge of the upper photoresist feature does not extend over the corresponding edge of the lower photoresist feature and the other edge of the upper photoresist feature does extend beyond the corresponding edge of the lower photoresist feature.

20 Claims, 3 Drawing Sheets

US 6,524,937 B1

SELECTIVE T-GATE PROCESS

FIELD OF THE INVENTION

The present invention relates to the selective fabrication of T-shaped metal structures and more particularly relates to the selective fabrication of T-shaped gates for field-effect transistors.

BACKGROUND OF THE INVENTION

As microwave communication technology moves forward, communication frequencies tend to shift toward higher frequency bands. Devices made of conventional silicon are suitable for applications below 2 GHz. For applications above 2 GHz, however, the devices typically are made of compound semiconductors such as GaAs- or InP-based materials, because GaAs, InP, and related compound semiconductors have electron mobilities that are higher than conventional silicon compounds.

Typically, field-effect transistors (FETs) in radio frequency and microwave circuits have short gate lengths (e.g., gate lengths that are smaller than 1 micron). Such devices have higher device gains and cutoff frequencies than their counterparts with longer gate lengths, primarily due to the lower gate-source capacitance and higher transconductance associated with shorter gate lengths. In addition, submicron gatelength devices have better noise characteristics.

As the length of the gate is reduced, however, its cross sectional area is also reduced, and the resistance of the gate is increased. High gate resistance is particularly detrimental to an FET during high-frequency operation. Effects of high gate resistance include a reduction in high-frequency device gain, current gain cutoff frequency and power gain cut-off frequency.

One way to address this trade-off between gate length and gate cross section is to provide the FET with a T-shaped gate (also frequently referred to as a "mushroom gate"). Procedures for forming gates of this type have been proposed in the prior art, several of which are disclosed in U.S. Pat. No. 5,766,967, the entire disclosure of which is hereby incorporated by reference.

Such gates (frequently referred to as the "gate finger") have a distinct undercut feature at the semiconductor surface, giving the gate its "T-shaped" appearance. This undercut feature minimizes gate length, while at the same time retaining a relatively large overall gate cross-sectional area. The undercut feature, however, is not desirable in connection with other metal features that are frequently deposited at the same time as the gate finger itself, such as manifolds and gate interconnect structures. In particular, this undercutting frequently results in poor step coverage (i.e., poor metal continuity) for subsequent overlay metals, resulting in decreased product reliability.

This prior art problem is illustrated in FIG. 1, which shows a T-shaped gate finger 12 on a substrate 18. Also shown is an adjacent T-shaped gate interconnect 14 with associated overlay metal 16. Both the T-shaped gate finger 12 and the T-shaped gate interconnect 14 are provided with substantial undercutting at the semiconductor interface. This undercutting is desirable in connection with the T-shaped gate finger 12 for the reasons set forth above. It is undesirable, however, in connection with the T-shaped gate interconnect 14 upon which the overlay metal 16 is applied. Specifically, as seen in FIG. 1, the undercutting associated with the T-shaped interconnect 14 can result in a discontinuity 20 (i.e., a void) within the overlay metal 16, reducing device reliability.

SUMMARY OF THE INVENTION

The above and other problems associated with the prior art are overcome by the present invention. According to one embodiment of the invention, a process is provided, along with a field effect transistor with a T-shaped gate formed by this process. The process comprises:

a) providing a doped semiconductor substrate comprising source electrodes and gate electrodes;

b) forming lower photoresist features having rounded shoulders over the source electrodes and the gate electrodes on the substrate;

c) forming a plurality of upper photoresist features over the lower photoresist features, wherein the upper photoresist features have undercut sides, and wherein the upper photoresist features comprise: (i) edges that do not extend to edges of the lower photoresist features, thereby leaving portions of the rounded shoulders uncovered and (ii) edges that extend beyond edges of the lower photoresist features, thereby covering portions of the substrate;

d) forming gate metal features and interconnect metal features (preferably in a single step) over the substrate, wherein the gate metal features comprise edges that extend beyond the substrate and terminate over the rounded shoulders, and wherein the interconnect metal features have edges that do not extend beyond the substrate; and e) removing the lower photoresist features and the upper photoresist features (preferably by dissolution) to produce a structure in which (i) the gate metal features have sides that are undercut at the substrate and (ii) the interconnect metal features do not have sides that are undercut at the substrate.

Preferably, the lower photoresist features are formed by a process comprising: applying a lower layer of photoresist; patterning the lower layer of photoresist to form a plurality of lower photoresist features; and heating the lower photoresist features (e.g., to 120–180° C.) such that edge portions of the lower photoresist features flow to form the rounded shoulders. Preferred materials for the lower layer of photoresist are positive photoresists.

The upper photoresist features are preferably formed by a process comprising: applying an upper layer of photoresist; and photolithographically forming the upper photoresist features. Prior to application of the upper photoresist layer, it is typically preferred to treat the lower photoresist features such that the dimensions of the lower photoresist features are stable upon subsequent application of the upper photoresist layer. Preferred processes for treating the lower photoresist features include (i) treatments comprising crosslinking (e.g., using deep ultraviolet light) surface portions of the lower photoresist features and (ii) treatments comprising the formation of a barrier layer (e.g., a metal, a metal oxide, or polymer precursors) that covers the lower photoresist features.

According to another embodiment of the invention, a process is provided, along with a field effect transistor constructed in accordance with this process. The process comprises:

a) providing a doped semiconductor substrate comprising source electrodes and gate electrodes;

b) applying a lower layer of photoresist over the source electrodes, the gate electrodes and the substrate;

c) patterning the lower layer of photoresist to form a plurality of lower photoresist features over the source electrodes and the gate electrodes;

d) heating the lower photoresist features such that edge portions of the lower photoresist features flow to form rounded shoulders;

e) treating the lower photoresist features such that dimensions of the lower photoresist features are stable upon application of an upper photoresist layer;

f) applying the upper layer of photoresist over the treated lower photoresist features;

g) photolithographically forming from the upper layer of photoresist a plurality of upper photoresist features over the lower photoresist features, wherein the upper photoresist features have undercut sides, and wherein the upper photoresist features comprise (i) edges that do not extend to edges of the lower photoresist features, leaving portions of the rounded shoulders uncovered and (ii) edges that extend beyond edges of the lower photoresist features, covering portions of the substrate;

h) conducting a metal deposition step such that temporary metal features are formed over the upper photoresist features, and such that gate and interconnect metal features are formed over the substrate, wherein the gate metal features comprise edges that extend beyond the substrate and terminate over the rounded shoulders, and wherein the interconnect metal features have edges that do not extend beyond the substrate; and i) dissolving the lower photoresist features and the upper photoresist features, such that the temporary metal features are removed and such that (i) the gate metal features have sides that are undercut at the substrate and (ii) the interconnect metal features do not have sides that are undercut at the substrate.

According to still another embodiment of the invention, a process for forming metal features is provided which comprises:

a) providing a substrate;

b) forming lower photoresist features with rounded shoulders over the substrate;

c) forming a plurality of upper photoresist features over the lower photoresist features, wherein the upper photoresist features have undercut sides, and wherein the upper photoresist features comprise: (i) edges that do not extend to edges of the lower photoresist features, leaving portions of the rounded shoulders uncovered and (ii) edges that extend beyond edges of the lower photoresist features, covering portions of the substrate;

d) forming temporary metal features over the upper photoresist features and forming permanent metal features over the substrate, wherein the permanent metal features comprise: (i) edges that extend beyond the substrate and terminate over the rounded shoulders, and (ii) edges that do not extend beyond the substrate; and e) removing the lower photoresist features and the upper photoresist features, such that the temporary metal features are also removed and such that the permanent metal features comprise: (i) sides that are undercut at the substrate and (ii) sides that are not undercut at the substrate.

One advantage of the present invention is that a T-shaped gate structure can be provided using commonly available photolithographic technology.

Another advantage of the present invention is that it provides a relatively simple method of forming a T-shaped gate and associated structures such as gate interconnects. Moreover, such associated structures need not be provided with an undercut feature like that associated with the T-shaped gate, reducing the likelihood of step coverage issues when overlay metal is applied.

These and other embodiments and advantages will be immediately apparent to those of ordinary skill in the art upon review of the Detailed Description and Claims to follow.

DETAILED DESCRIPTION OF THE INVENTION

The present invention now will be described more fully hereinafter with reference to the Figures, in which preferred embodiments of the present invention are shown. This invention may, however, be embodied in different forms and should not be construed as limited to the embodiments set forth herein.

FIGS. 2A to 2H illustrate a process for simultaneously fabricating a T-shaped gate and an associated metallization feature for a field effect transistor in accordance with an embodiment of the present invention. As previously noted, T-shaped gate structures are useful in connection with microwave field effect transistors, including MESFETs, HEMTs (including pHEMTs) and HFETs.

Figure 1:
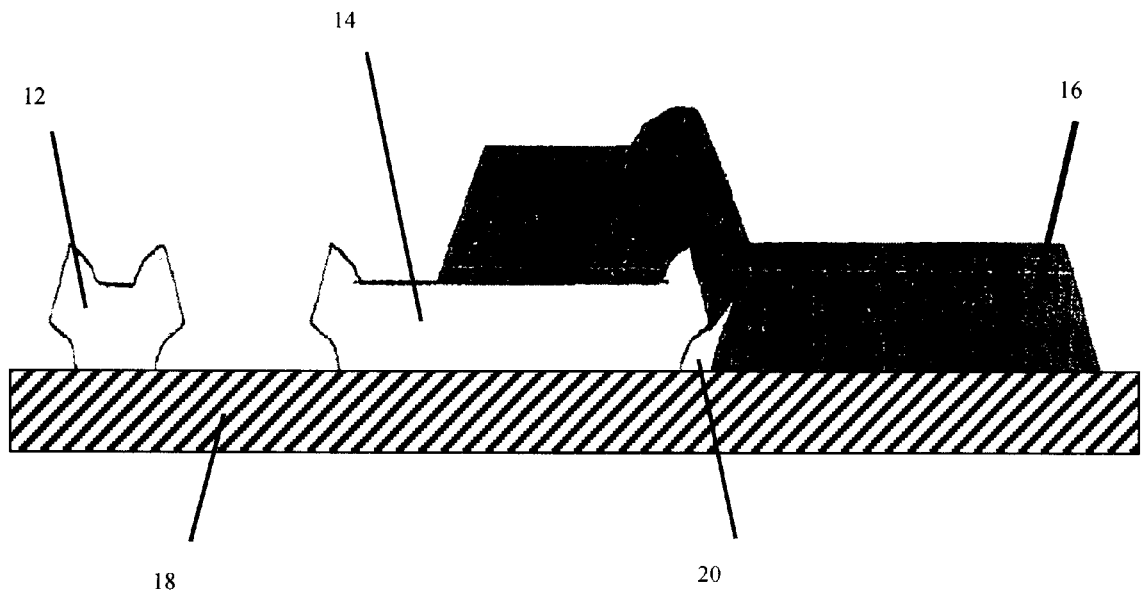
FIG. 1 is a cross-sectional view illustrating a T-shaped gate finger, a T-shaped gate interconnect and overlay metal on a substrate. The overlay metal exhibits a common problem of the prior art—a discontinuity at the T-shaped gate interconnect.
Figure 2A:
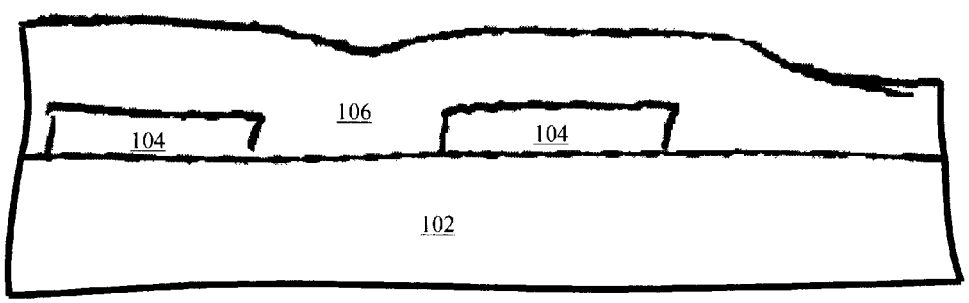
FIGS. 2A to 2H are cross-sectional views illustrating a process for fabricating a T-shaped gate and adjacent metallization in accordance with an embodiment of the present invention.

Referring now to FIG. 2A, ohmic metal pads 104 are provided on an appropriately doped semiconductor substrate 102 by methods well known in the art. The semiconductor substrate 102 is preferably a high mobility material such as GaAs, InP or other compound semiconductor typically used for microwave device fabrication. In this embodiment, the ohmic metal pads 104 correspond to source and drain electrodes for the field effect transistor.

A lower layer of photoresist 106 is applied over the substrate 102 and the ohmic pads 104. The resulting product is that shown in FIG. 2A. As will be more readily apparent below, the photoresist 106 is preferably one having the following properties: (1)the ability to reflow upon heating, (2)the ability to undergo hardening upon exposure to ultraviolet light and (3)relative ease of dissolution during metal liftoff. Preferred photoresists for this purpose are typically positive photoresists. More preferably, the photoresists are those capable of high resolution, such as Shipley SPR 950 (Shipley Company, Marlborough, Mass.) or AZ 7908 (AZ Electronic Materials, Somerville N.J.).

Figure 2B:
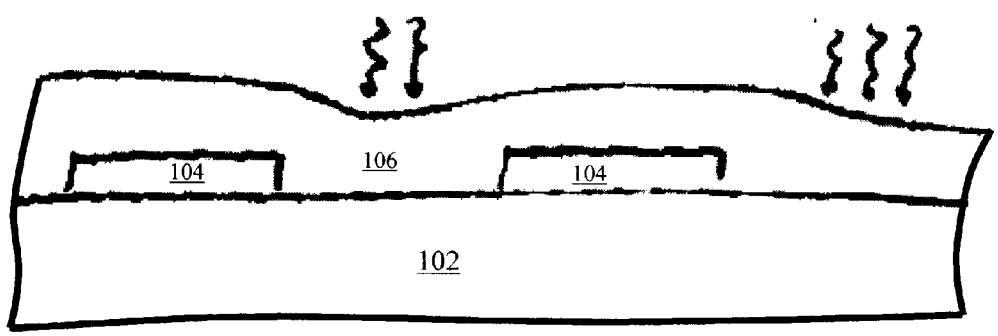
Figure 2C:
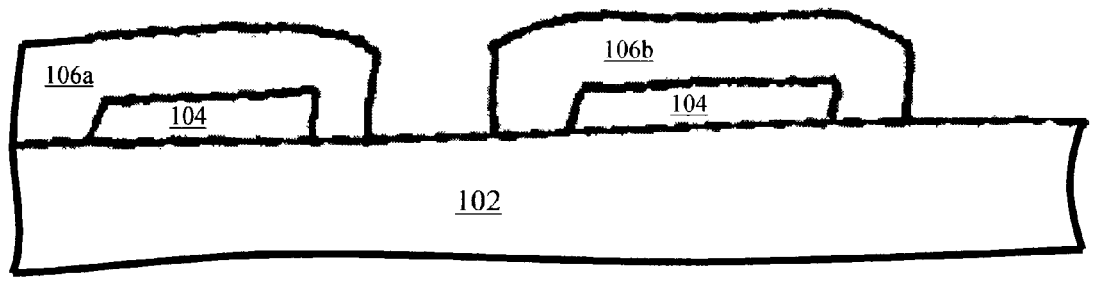

Referring now to FIG. 2B, the lower photoresist layer 106 is then exposed through a photomask (not shown). As noted in the prior paragraph, preferred photoresists (including the one in FIG. 2B) are positive photoresists (i.e., photoresists in which exposure changes the chemical structure from a relatively nonsoluble state to a relatively soluble one). As a result, after exposure, the exposed portions are more easily removed during development, leaving behind lower photoresist features 106a and 106b as shown in FIG. 2C. Essentially any developer can be used to remove the exposed portions, so long as the desired result is achieved. Preferred developers include, for example, tetramethyl ammonium hydroxide, trisodium phosphate or potassium hydroxide. A particularly preferred developer for the practice of the present invention is 0.26 N tetramethyl ammonium hydroxide.

Figure 2D:
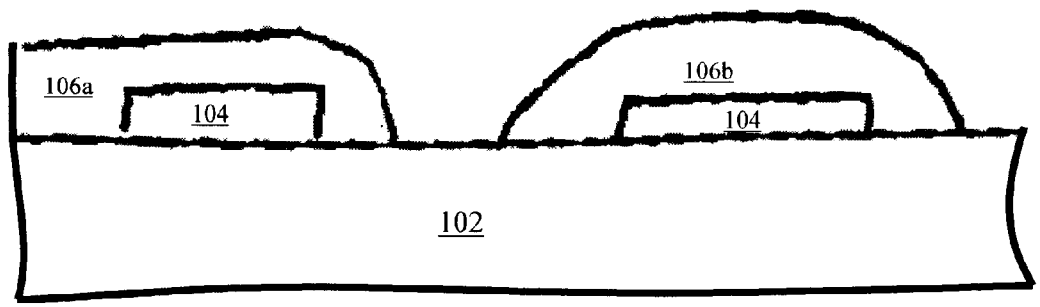

As shown in FIG. 2D, the morphologies of the lower photoresist features 106a and 106b are then altered by a reflow step in which the lower photoresist features 106a and 106b are heated to a temperature and for a time appropriate to provide them with rounded shoulders. By "rounded shoulders" is meant that the top surfaces of the lower photoresist features gradually fall away toward the substrate at the outer edges of the lower photoresist feature are approached. For the photoresists used in this example, a temperature of 120–180° C. is appropriate. As a specific example, exposure to a temperature of 120–180° C. for 30 seconds has been found to be satisfactory for the practice of the present invention.

An upper photoresist layer is then applied to the structure. However, before this step is performed, the lower photoresist features 106a and 106b are preferably treated in a fashion such that these features are rendered insoluble in the second layer. In this way, the dimensions of the lower photoresist features 106a and 106b, and hence the gate dimensions at the bottom of the gate (see below), will be preserved upon application of the upper photoresist layer.

A preferred process for treating the lower photoresist features 106a and 106b is to crosslink the outer skin of the features, preferably by using deep ultraviolet light exposure and then thermally crosslink the remainder of the photoresist. In general, the combination of ultraviolet exposure and hardbake should be sufficiently extensive to render the lower photoresist features 106a and 106b substantially insoluble in the upper photoresist layer, but not so extensive as to create unnecessary difficulty when removing the lower photoresist features 106a and 106b in subsequent processing steps. As a specific example, this step can be conducted by exposing the lower photoresist features 106a and 106b to 400–750 millijoules/cm² using an HMOD lamp available from Fusion UV Systems Inc., Gaithersburg, Md., and following this with 30 seconds or less of a 180° C. bake.

Alternatively, the lower photoresist features 106a and 106b can be treated by providing them with a barrier layer (not shown). Preferred barrier layers for this embodiment of the invention are metal or metal oxide layers, which can be provided, after appropriate masking, by evaporation and deposition processes. Other preferred barrier layers can be provided by application of polymer precursors, such as R200 from AZ Electronic Materials.

Figure 2E:
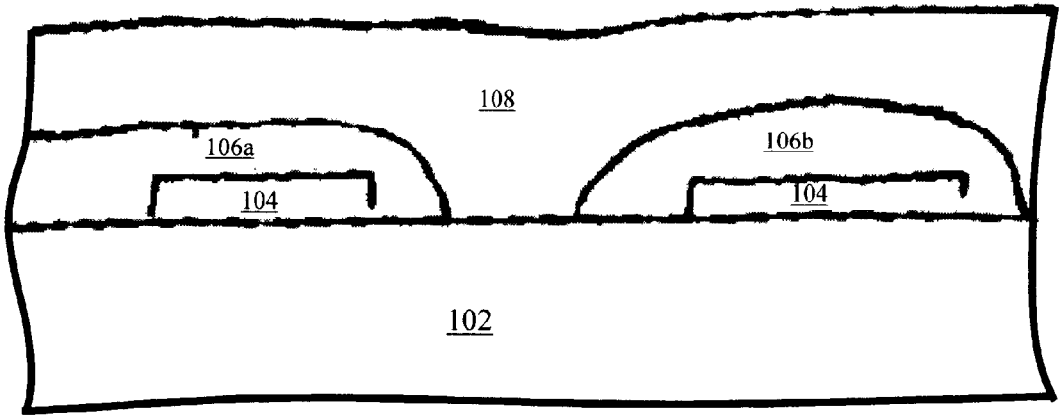
Figure 2F:
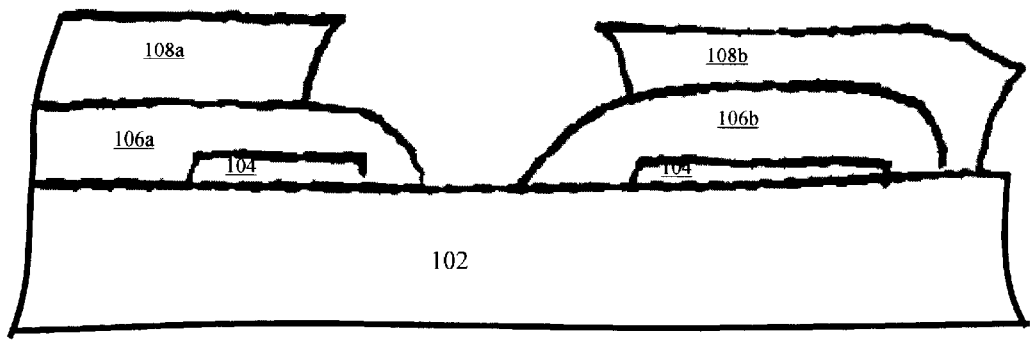

An upper photoresist layer 108 is then applied as shown in FIG. 2E, followed by photolithography and development to yield upper photoresist features 108a and 108b as shown in FIG. 2F. As can be seen in this figure, the sides of upper photoresist features 108a and 108b are undercut (i.e., upper portions of the sides extend laterally outwardly beyond lower portions of the sides).

Numerous ways are known in the art to achieve an undercut structure like that shown for photoresist features 108a and 108b.

According to one preferred embodiment of the invention, a develop inhibition process is carried out. As an example, a contrast enhancement material can be applied to the upper photoresist layer, whereupon it mixes with the upper photoresist layer at high temperatures to make the surface region of the upper photoresist layer less soluble in developer. However, some resists, such as the BPRS series of resists from Olin Microelectronic Materials, Norwalk, Conn., intrinsically form a develop inhibiting surface without such surface treatment.

Other techniques known in the art, such as image reversal techniques, can also be used to photoresist features with an undercut structure.

Referring again to FIG. 2F, it is noted that the right-hand edge of upper photoresist feature 108b extends beyond the edge of the right-hand shoulder of lower photoresist feature 106b and onto the substrate 102, covering both the shoulder and a portion of the substrate 102.

In contrast, the left-hand edge of upper photoresist feature 108b does not extend beyond the edge of the left-hand shoulder of the lower photoresist feature 106b, but rather leaves at least a portion of the left-hand shoulder exposed. Similarly, the right-hand edge of the upper photoresist feature 108a does not extend beyond the edge of the right-hand shoulder of the lower photoresist feature 106a, instead leaving at least a portion of the right-hand shoulder of the lower photoresist feature 106a exposed.

This relative positioning of photoresist features 106a/108a and 106b/108b, along with the morphology of these features (e.g., features 106a and 106b have left and right rounded shoulders, while features 108a and 108b have left and right undercutting) produces a desirable result upon subsequent gate metal deposition. Essentially any low-resistivity metal or alloy such as gold, silver and/or copper, with gold being preferred, can be used for gate metal deposition. When the gate metal is deposited on the structure of FIG. 2F, for example, by evaporation, the result is the structure shown in FIG. 2G. As seen in this figure, the relative placement and morphology of photoresist features 106a/108a and 106b/108b causes the deposited metal 110g between these features to be in the form of a T-shaped gate. In contrast, the morphology and relative placement of photoresist features 106b/108b causes the right-hand deposited metal 110r to be in a form that is without the undercutting that is characteristic of the T-shaped gate 110g.

Figure 2G:
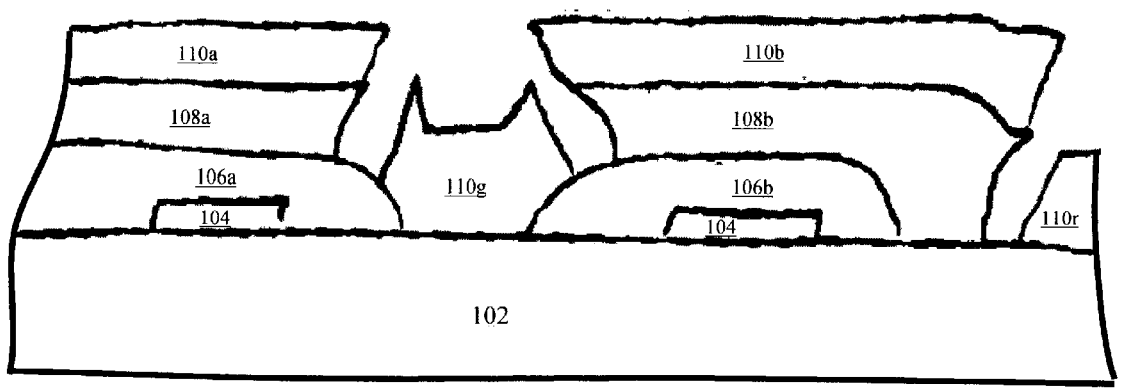

As previously noted, T-shaped gates, with their distinct and substantial undercut at the semiconductor surface, tend to maximize the cross-sectional area of the gate throughout most of the gate structure, while at the same time minimizing the gate length at the semiconductor surface. This undercutting, however, is not desirable in connection with additional metal features (such as manifolds and gate interconnect structures that are deposited at the same time as the gate itself), because the undercutting frequently results in poor step coverage (i.e., poor metal continuity) for subsequent overlay metals, resulting in decreased product reliability. As seen in FIG. 2G, by using the technique of the present invention, those of ordinary skill in the art can control which features are provided with undercutting and which features are not.

It is noted that the T-gate shown in FIG. 2G is symmetric. In other embodiments, it may be desirable to shift the top of the T-gate toward the source to reduce parasitic capacitance. This can be carried out, for example, by simply shifting the photomask used in the process of forming upper photoresist features 108a and 108b toward source.

Figure 2H:
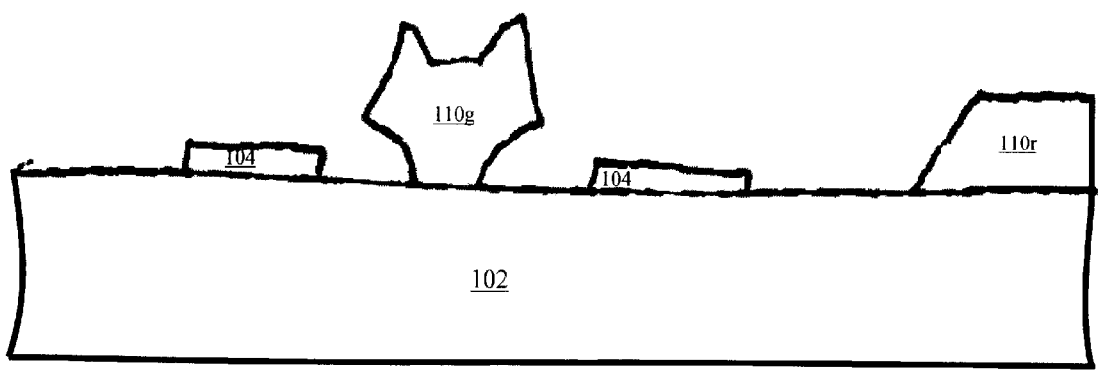

Liftoff of unwanted deposited metal 110a and 110b can then be carried out by dissolving the photoresist features 106a, 106b, 108a and 108b to produce the structure of FIG. 2H. Numerous solvents and solvent combinations are appropriate for this purpose. Where a deep ultraviolet exposure step is used to crosslink the lower photoresist features 106a and 106b and render them substantially insoluble in the upper photoresist layer 108 (see above), the solvents are typically more aggressive than they would otherwise be in the absence of the crosslinking step. In one specific preferred process, a relatively mild stripper such as n-methyl pyrrolidone (NMP) is applied, followed by, if necessary, application of a relatively aggressive stripper such as ST23 (ATMI, Inc., Danbury Conn.) for a few seconds.

Additional steps well known in the art, such as further metallization steps, can then be conducted to provide a final form for the field effect transistor.

Although various embodiments are specifically illustrated and described herein, it will be appreciated by those of ordinary skill in the art that various changes and modifications may be made without departing from the spirit and scope of the invention.

What is claimed is:

1. A process for forming a field effect transistor with a T-shaped gate comprising:
   providing a doped semiconductor substrate comprising source electrodes and drain electrodes;
   forming lower photoresist features over said source electrodes and drain electrodes on said substrate, said lower photoresist features having rounded shoulders;
   forming a plurality of upper photoresist features over said lower photoresist features, said upper photoresist features having undercut sides, and said upper photoresist features comprising (i) edges that do not extend to edges of said lower photoresist features, thereby leaving portions of said rounded shoulders uncovered and (ii) edges that extend beyond edges of said lower photoresist features, thereby covering portions of said substrate.
   forming gate metal features and interconnect metal features simultaneously over said substrate, said gate metal features comprising edges that extend beyond said substrate and terminate over said rounded shoulders, and said interconnect metal features having edges that do not extend beyond said substrate; and
   removing said lower photoresist features and said upper photoresist features to provide a structure in which (i) said gate metal features have sides that are undercut at the substrate and (ii) said interconnect metal features do not have sides that are undercut at the substrate.

2. The process of claim 1, wherein said lower photoresist features are formed by a process comprising: applying a lower layer of photoresist; patterning said lower layer of photoresist to form a plurality of lower photoresist features; and heating said lower photoresist features such that edge portions of said lower photoresist features flow to form said rounded shoulders.

3. The process of claim 2, wherein said lower photoresist features are heated to a temperature of 120–180° C.

4. The process of claim 2, wherein said lower layer of photoresist is a positive photoresist layer.

5. The process of claim 1, wherein said upper photoresist features are formed by a process comprising: applying an upper layer of photoresist; and photolithographically forming said upper photoresist features.

6. The process of claim 5, further comprising treating said lower photoresist features such that dimensions of said lower photoresist features are stable upon subsequent application of said upper photoresist layer.

7. The process of claim 6, wherein said lower photoresist features are treated by a process comprising crosslinking surface portions thereof.

8. The process of claim 7, wherein said surface portions of said lower photoresist features are crosslinked using deep ultraviolet light.

9. The process of claim 6, wherein said lower photoresist features are treated by a process comprising covering said lower photoresist features with a barrier layer.

10. The process of claim 9, wherein said barrier layer is a metal, a metal oxide, or polymer precursors.

11. The process of claim 1, wherein said gate metal features and said interconnect metal features are formed in a single deposition step.

12. The process of claim 1, wherein said lower photoresist features and said upper photoresist features are removed by dissolution.

13. A field effect transistor constructed in accordance with the process of claim 1.

14. A process for forming a field effect transistor with a T-shaped gate electrode comprising:
    providing a doped semiconductor substrate comprising source electrodes and drain electrodes;
    applying a lower layer of photoresist over said source electrodes, said drain electrodes and said substrate;
    patterning said lower layer of photoresist to form a plurality of lower photoresist features over said source electrodes and said drain electrodes;
    heating said lower photoresist features such that the edge portions of the lower photoresist features flow to form rounded shoulders on said lower photoresist features;
    treating said lower photoresist features such that dimensions of said lower photoresist features are stable upon application of an upper photoresist layer;
    applying said upper layer of photoresist over said treated lower photoresist features;
    photolithographically forming from said upper layer of photoresist a plurality of upper photoresist features over said lower photoresist features, said upper photoresist features having undercut sides, and said upper photoresist features comprising (i) edges that do not extend to edges of said lower photoresist features, leaving portions of said rounded shoulders uncovered and (ii) edges that extend beyond edges of said lower photoresist features, covering portions of said substrate;
    conducting a metal deposition step such that temporary metal features are formed over said upper photoresist features, and such that gate and interconnect metal features are simultaneously formed over said substrate, said gate metal features comprising edges that extend beyond said substrate and terminate over said rounded shoulders, said interconnect metal features having edges that do not extend beyond said substrate; and
    dissolving said lower photoresist features and said upper photoresist features, such that said temporary metal features are removed and such that (i) said gate metal features have sides that are undercut at the substrate and (ii) said interconnect metal features do not have sides that are undercut at the substrate.

15. The process of claim 14, wherein said lower photoresist features are treated by a process comprising crosslinking surface portions thereof.

16. The process of claim 15, wherein said surface portions of said lower photoresist features are crosslinked with ultraviolet deep light.

17. The process of claim 14, wherein said lower photoresist features are treated by a process comprising covering said lower photoresist features with a barrier layer.

18. The process of claim 17, wherein said barrier layer is a metal, a metal oxide, or polymer precursors.

19. A field effect transistor constructed in accordance with the process of claim 14.

20. A process for providing metal features comprising:

providing a substrate;

forming lower photoresist features with rounded shoulders over said substrate;

forming a plurality of upper photoresist features over said lower photoresist features, said upper photoresist features having undercut sides, and said upper photoresist features comprising (i) edges that do not extend to edges of said lower photoresist features, leaving portions of said rounded shoulders uncovered and (ii) edges that extend beyond edges of said lower photoresist features, covering portions of said substrate;

forming temporary metal features over said upper photoresist features and permanent metal features over said substrate, said permanent metal features being formed simultaneously with one another and comprising (i) edges that extend beyond said substrate and terminate over said rounded shoulders, (ii) edges that do not extend beyond said substrate; and removing said lower photoresist features and said upper photoresist features, such that said temporary metal features are also removed and such that said permanent metal features comprise (i) sides that are undercut at the substrate and (ii) sides that are not undercut at the substrate.

* * * * *